United States Patent
Fischer-Binder (12)

(10) Patent No.: US 6,249,897 B1
(45) Date of Patent: Jun. 19, 2001

(54) PROCESS FOR SIZING OF COMPONENTS

(75) Inventor: Jörg-Oliver Fischer-Binder, Meldorf (DE)

(73) Assignee: ComCAD GmbH Analog Design Support, Meldorf (DE)

( * ) Notice: Subject to any disclaimer, the term of this patent is extended or adjusted under 35 U.S.C. 154(b) by 0 days.

(21) Appl. No.: 09/136,234

(22) Filed: Aug. 19, 1998

(30) Foreign Application Priority Data

Aug. 20, 1997 (DE) .............................................. 197 36 043

(51) Int. Cl.[7] ...................................................... G06F 17/50
(52) U.S. Cl. .................................... 716/2; 716/4; 716/18; 703/2
(58) Field of Search ............................... 716/1–21; 703/2; 395/500.02–500.19, 500.23

(56) References Cited

U.S. PATENT DOCUMENTS

| | | | |
|---|---|---|---|
| 5,459,673 | * | 10/1995 | Carmean et al. .......................... 716/6 |
| 5,508,937 | * | 4/1996 | Abato et al. .............................. 716/6 |
| 5,654,898 | * | 8/1997 | Roetcisoender et al. ................. 716/9 |
| 5,689,432 | * | 11/1997 | Blaauw et al. .......................... 716/18 |
| 5,751,593 | * | 5/1998 | Pullela et al. ........................... 716/6 |
| 5,764,531 | * | 6/1998 | Kojima et al. ........................... 716/6 |
| 5,880,967 | * | 3/1999 | Jyu et al. ................................. 716/6 |
| 5,903,466 | * | 5/1999 | Beausang et al. ....................... 716/8 |
| 5,910,897 | * | 6/1999 | Dangelo et al. ....................... 716/19 |
| 5,910,898 | * | 6/1999 | Johannsen ............................... 716/1 |
| 6,009,248 | * | 12/1999 | Sato et al. ............................... 716/2 |
| 6,074,429 | * | 6/2000 | Pullela et al. ........................... 716/6 |
| 6,090,151 | * | 7/2000 | Gehman et al. ........................ 716/5 |

OTHER PUBLICATIONS

Lillis et al. ("Optimal Wire Sizing and Buffer Insertion for Low Power and a Generalized Delay Model", IEEE Journal of Solid–State Circuits, vol. 31, No. 3, Mar. 1996, pp. 437–447).*

* cited by examiner

Primary Examiner—Matthew Smith
Assistant Examiner—Phallaka Kik
(74) Attorney, Agent, or Firm—Dority & Manning

(57) ABSTRACT

The present invention relates to a process for the sizing of components in a given componentry, in particular an electronic circuit, which fulfills a predetermined functionality defined in particular in marginal conditions. The individual components have characteristics which are essentially predetermined and are described in mathematical equations, and the components produce interactions based on their utilization in the given componentry or electronic circuit. The characteristics and/or interactions described by equations are resolved by means of a computer, whereby the results obtained of the first resolved equations related to the required components are used in the resolution of additional equations. The solution and further treatment of those ranges of resolution possibilities which are without practical relevance to the sizing of the components in the given electronic circuit are not used.

11 Claims, No Drawings

PROCESS FOR SIZING OF COMPONENTS

BACKGROUND OF THE INVENTION

The present invention relates to a process for sizing elements in a predetermined componentry, in particular an electronic circuit which must possess a predetermined functionality, defined especially in its marginal conditions, whereby the individual components have characteristics which are essentially predetermined and described through mathematical equations, and whereby the components produce reciprocal action due to their utilization in the predetermined componentry or circuit.

Processes are known by means of which components in componentry can be sized in various technical areas with a given description of the marginal conditions of a technical implementation and from the also known description of desired characteristics of a componentry unit. Such processes are used in particular in designing electronic circuits. Processes and devices to size the components of digital switching systems such as those being offered on the market by the companies such as Synopsis Inc. or Mentor Graphics Inc. are examples for this.

For some time, processes have also been known that are used for special applications of electronic circuits in the field of analog circuit technology. Processes for the sizing of switch capacitor circuits in the area of value-continuous and time-continuous circuits such as operational amplifiers are examples for this.

The processes of the state of the art operate on the following basic principle: a mathematical equation system is elaborated which represents the physical system to be sized, e.g., the given electronic circuit. This equation system is then broken down into explicit solvable system elements and remaining implicit system elements, which are then treated by means of numerical, interactive methods. The success of this method is extremely dependent upon marginal conditions and the structure of the physical system to be created. The starting values for the computation of the implicit equation system elements are treated as constants which are found independently from the physical system to be sized and are integrated into the equation system.

The processes of the state of the art have in common the fact that they attempt to transpose a mathematically incompletely defined problem into a mathematically completely defined problem and seek to solve it. However, such a process does not always provide a technical solution because the problem to be solved cannot always be transposed into a completely defined problem. A useful, complete technical solution is therefore not always obtained.

OBJECTS AND SUMMARY OF THE INVENTION

It is therefore a principal object of the present invention to create a process by means of which it becomes possible to determine the necessary size of components even in large componentries with large equation systems and thus to obtain a usable technical solution for a given functionality. Additional objects and advantages of the invention will be set forth in part in the following description, or may be obvious from the description, or may be learned through practice of the invention.

In accord with the present invention, the process is for sizing components in a given componentry, in particular an electronic circuit which must fulfill a predetermined functionality which is in particular defined in marginal conditions. The individual components have characteristics which are substantially predetermined and described in mathematical equations and produce interactions as a result of their utilization in the given componentry or electronic circuit. The characteristics and/or interactions described by the equations are resolved by means of a computer. As equations are resolved, the obtained results of the first resolved equations for the required components are used for the resolution of the additional equations. The process also dispenses with the resolution and further processing of those ranges of the resolution possibilities which are without practical relevance for the sizing of the components in this given electronic circuit.

DETAILED DESCRIPTION

Reference will now be made in detail to the presently preferred embodiments of the invention. Each example is provided by way of explanation of the invention, and not meant as a limitation of the invention. For example, features illustrated or described as part of one embodiment can be used on another embodiment to yield a still further embodiment. It is intended that the present application include such modifications and variations.

If the characteristics and/or interactions described by the equations are resolved by means of a computer, then the obtained results of the first resolved equations are used for the necessary components in the resolving of the other equations. It is especially important that the solution and further processing of those solution possibilities that are without practical relevance for the sizing of the components in this predetermined componentry or electronic circuit be abandoned. Eliminating these irrelevant solution possibilities makes it possible to eliminate the necessity of resolving the complete equation system, and instead requires that only those parts of the equation system for the configuration of the components to be integrated into the actual componentry (circuit) be computed. The other equations, which would lead to solutions that would not be required in the application of the given componentry (circuit), are not computed. In this manner, a substantially simpler equation system must be resolved which can be processed in a substantially shorter time and with less powerful computers. In addition, a technical system, for example a circuit with components sized in this manner, is obtained that possesses exactly the required functionality needed for the circuit. Thereby, the advantage of a more easily computed equation system for the obtention of correctly sized components as well as a componentry with precisely the predetermined and desired functionality is obtained.

It is especially advantageous if the ranges of solution possibilities which are of significance in view of the predetermined functionality of the given componentry, in particular of the intended electronic circuit, are given. The process according to the invention is thereby further simplified since the equation system is restricted in the sense that only the relevant equations or resolutions of an equation need to be considered.

If the system finds that contradictory or uncertain resolution possibilities are resulting from the equation system and thereby contradictory or uncertain data for the sizing of the components result, then the ranges of solution possibilities for functionalities without practical relevance in this componentry can be excluded during the computation of the equation system or the sizing of the components on the basis of the given functionality of the componentry or the electronic circuit. This exclusion also results in continuing the advantageous search of only those resolution possibilities which are actually to be used in the desired componentry without obtaining oversized or even undersized components.

In case of contradictory or uncertain resolution possibilities, ranges of resolution possibilities are either reduced or changed with respect to their relevance. Definite and certain resolutions can, however, also be obtained by changing the starting values of the computation. The starting values, which are selected in the form of constant values within the marginal conditions, make it possible to resolve the equation system by retaining exemplar values within the desired value range. Depending on the selection of the starting value, the equation system may be easier or more difficult to resolve. Therefore, it may be advantageous to change the starting value, so that a previously hard to resolve equation system can now be resolved easily and definitely. In case of a contradictory or uncertain resolution, it may be advantageous as a function of already previously made changes, if a hierarchy in the changes of the range, starting values, or changes of marginal conditions is established. It may, therefore, be advantageous that the marginal conditions for the functionality of the electronic circuit be changed only as the last one of the changes to be made, i.e., only when the first two types of changes have not led to any definite resolution. This means that under certain circumstances the functionality of the componentry is also changed, that is to say that the possible temperature application range of a componentry must be changed.

It is especially advantageous in the present invention that the marginal conditions and/or the starting value can be determined by the computer before and/or during the computation of the equations for the sizing of the components. During the computation of the equations, a change of the starting values makes it possible to simplify the complex equation system from that point on. Rapid and reliable sizing of the components by means of a computer is thus made possible, especially for the desired range.

Marginal conditions are understood to be values of the functionality of the componentry or circuit, such as voltage ranges $X_1$ to $X_2$ Volt, admissible current forces $Y_1$ to $Y_2$ Watt, etc. These values of the functionality are given and/or changed before and/or during the computation of the equations. This makes it advantageously possible for the equation systems for the sizing of the components within the componentry to yield definite results. A resolution of the equation system can be expected due to the fact that during the computation of the equations, the values of the functionality can be changed as needed.

As starting values for the computation, values within the marginal conditions are selected. These values are, for example, X Volt or Y Watt which are between $X_1$ and $X_2$ Volt or $Y_1$ and $Y_2$ Watt. These starting values are given and/or changed before and/or during the computation of the equations. When the equation system can not be given a definite resolution, the starting values are changed within the marginal conditions, so that the equation system can now be resolved for the required functionality of the componentry. If these starting values still fail to yield a definite resolution, then the starting value can again be changed until a definite resolution is obtained or until it is ascertained that a definite resolution cannot be obtained. In this case, the marginal conditions or the ranges of the functionality must also be changed.

It is advantageous if the presence of contradictory or indefinite resolution possibilities is displayed on the computer. In that case, a decision can be made as to what measures should be taken in order to obtain a resolution of the equation system for the desired sizing of the component.

In the case of contradictory resolution possibilities, a manual entry into the system can achieve the selection of the relevant resolution possibilities. The same also applies to the selection of the starting values and the marginal conditions as well as to the relevant ranges of the functionalities.

Just as in the case of contradictory or indefinite resolution possibilities of the equation system, it is also advantageous for the computation to be carried out again with new starting values and/or marginal conditions in case of unsatisfactory or incomplete sizing of the components. This may be necessary, for example, when the system concludes that certain components are to be used for the componentry, while these components are not available for utilization in the componentry for cost reasons.

If concrete starting values and/or marginal conditions to be changed are entered into the computer, then the automatic search of the computer is advantageously shortened and the solution or proposal for a concrete sizing of the components is obtained more rapidly.

It is especially advantageous if starting values or possibly also marginal conditions for a particular renewed computation of the sizing of the components is proposed or selected automatically by the computer.

In a semi-automatic version, it is advantageous if the computer proposes certain starting values or marginal conditions, which are to be changed. This version is especially advantageous when it is possible to indicate through the computer which starting values or marginal conditions lead to difficult equations or contradictory or indefinite solutions in the computation of the sizing of the components, and therefore should be changed. In that case, it may also be helpful if the computer were to indicate whether the previously selected starting value or the previously selected marginal condition should be amplified or reduced.

A particularly capable and thereby advantageous process is achieved when a resolution strategy is found by means of the changed starting values and/or marginal conditions, said strategy being used with other, similar problems as a first resolution strategy to be explored. Thereby, the components in additional componentries, particularly in additional electronic circuits, can be sized. The system thereby determines that a similar or identical problem has already occurred in previous sizings of components in other componentries, and compares the changes in starting values or marginal conditions which were made then with the current situation. If it is found that a similar situation is indeed present, then the first resolution strategy used or proposed for the new problem will be the resolution strategy of the former problem, which has brought success. It is thereby possible to carry out a successful sizing of the components more rapidly, as errors in the changing of starting values or marginal conditions, which had occurred in the former problem, need not be made again.

It has been found to be advantageous from the point of view of low necessity for change of starting values or marginal conditions that the simple equations are resolved first, and only subsequently are the more complicated equations resolved. The resolution of the simpler equations may yield values under certain circumstances that rapidly lead to further solutions as they are inserted into the more complicated equations, because the more complicated equations have been simplified in this manner. The system, thus, becomes even more efficient and only requires small changes or no changes at all of the starting values or marginal conditions.

The computation of equations has been shown to be especially simple when the equations were sorted by anticipated degree of difficulty before their computation. Thereby, an easy processing of the equations in the equation systems is possible.

The process according to the invention makes it possible to find suitable starting values for the internal states of the resolution mechanism and to insert them in the latter. Thereby, a resolution strategy can be produced, which can again be used at any time in the resolution of a similar problem. In the case of such re-use of a resolution strategy, much time is gained in sizing the components of a componentry. It is advantageous in the present invention that the scope of resolutions is restricted to the finding of the starting values. This is effected either through the computer alone or in a dialogue between the computer and the user. The described resolution process is repeated until a usable technical realization of the desired componentry has been found.

It will be appreciated by those skilled in the art that various modifications and variations can be made in the present invention include such modifications and variations as come within the scope of the appended claims and their equivalents.

What is claimed is:

1. A computer implemented process for sizing active and passive components of an electronic circuit, the electronic circuit fulfilling a predetermined function, said process comprising the steps of:

a.) for the electronic circuit, defining marginal conditions relating to the functionality of the circuit in the form of values;

b.) defining a system of mathematical equations that represent predetermined characteristics of the active and passive components of the electronic circuit;

c.) defining constant starting values for computation of equation resolutions that are within the marginal conditions;

d.) analyzing the system of mathematical equations by separating the equations in a hierarchical order and using the defined marginal conditions to solve the equations by:

(i) solving a first set of the equations using the constant starting values, (ii) using results from the first solved set of equations to solve additional sets of equations according to said hierarchical order, and (iii) for each of the steps (i) and (ii), disregarding resolutions and ranges of resolution possibilities that have no practical relevance for sizing of the components, and e.) sizing the active and passive components of the electronic circuit in accordance with the solved equations obtained from steps d(i)–d(iii).

2. A process as in claim 1, comprising using given ranges of resolution possibilities for the equations which are relevant for the predetermined functionality of the circuit.

3. A process as in claim 2, comprising sorting the system of equations by degree of difficulty of the computations of the equations before computation, then resolving simpler equations first before solving more complicated equations.

4. A process as in claim 1, comprising restricting contradictory or indefinite resolution possibilities depending on the relevance of the ranges to the sizing of the components.

5. A process as in claim 1, comprising changing starting values of the computations when contradictory or indefinite resolution possibilities result from analysis of the equations.

6. A process as in claim 5, comprising changing marginal conditions of the functionality of the circuit components when contradictory or indefinite resolution possibilities still result from analysis of the equations after changing starting values.

7. A process as in claim 1, comprising selecting relevant ranges of the resolution possibilities manually.

8. A process as in claim 1, comprising determining a combination of the marginal conditions and the starting values for computation of the sizing of components during the computations of the equations.

9. A process as in claim 1, comprising changing any combination of starting values and marginal conditions when an unsatisfactory or incomplete sizing of the components occurs.

10. A process as in claim 1, comprising proposing automatically any combination of starting values and marginal conditions for computations of the sizing of similar components and renewed computations of the same component.

11. A process as in claim 1, comprising determining a resolution strategy by using any combination of starting values and marginal conditions used to resolve other similar equations as a first resolution strategy for sizing of the components of the circuit.

* * * * *